(12) United States Patent
Shimazaki et al.

(10) Patent No.: US 6,959,250 B1
(45) Date of Patent: Oct. 25, 2005

(54) METHOD OF ANALYZING ELECTROMAGNETIC INTERFERENCE

(75) Inventors: Kenji Shimazaki, Hyogo (JP); Hiroyuki Tsujikawa, Shiga (JP); Seijirou Kojima, Kyoto (JP); Shouzou Hirano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 344 days.

(21) Appl. No.: 09/615,938

(22) Filed: Jul. 13, 2000

(30) Foreign Application Priority Data

Jul. 14, 1999 (JP) .......................................... P.11-200847

(51) Int. Cl.$^7$ .......................... G01R 23/00; G01R 23/04
(52) U.S. Cl. .......................................... 702/75; 324/612
(58) Field of Search ................................ 324/612, 750, 324/751, 765, 95, 501; 702/65, 66, 69, 71, 74, 75, 106, 107, 115, 117, 124, 126, 182, 183, 189, 191, 193, 194, 195

(56) References Cited

U.S. PATENT DOCUMENTS

| | | | | |
|---|---|---|---|---|
| 5,117,377 A | * | 5/1992 | Finman .......................... | 703/2 |
| 5,479,440 A | | 12/1995 | Esfahani ...................... | 375/346 |
| 5,671,147 A | * | 9/1997 | McKim, Jr. et al. .......... | 702/77 |
| 5,764,044 A | * | 6/1998 | Calero ........................ | 324/76.15 |
| 5,784,285 A | * | 7/1998 | Tamaki et al. ................. | 702/66 |
| 5,845,233 A | * | 12/1998 | Fishburn ..................... | 702/108 |
| 5,847,966 A | * | 12/1998 | Uchino et al. ................. | 716/2 |
| 5,890,095 A | * | 3/1999 | Barbour et al. ................ | 702/40 |
| 6,066,177 A | * | 5/2000 | Hatsuda ........................ | 703/19 |

OTHER PUBLICATIONS

Burch et al., "Pattern–Independent Current Estimation for Reliability Analysis of CMOS Circuits",1988, 25th DA Conference, pp. 294–299.*

"Di/dt Noise in CMOS Integrated Circuits", Analog Interated Circuits and Signal Processing, 14, 1997, pp. 113–129.

"EMI–Noise Analysis under ASIC Design Environment", Proc. ISPD '99, 1999, pp. 16–21.

"Interconnect and Circuit Modeling Techniques for Full–Chip Power Noise Analysis", IEEE Transactions on Components, Packaging, and Manufacturing Technology–Part B. vol. 21, No. 3, Aug. 1998, pp. 209–215.

"Power Supply Noise Analysis Methodology for Deep–Submicron VLSI Chip Design", Proc. 34$^{th}$ DAC, Jun. 1997, pp. 1–6.

"A Macroscopic Substrate Noise Model for Full Chip Mixed–Signal Design Verification", 1997 Symposium on VLSI Circuits Digest of Technical Papers, pp. 37–38.

"Design Methodologies for Noise in Digital Integrated Circuits", Proc. 35$^{th}$ DAC, Jun. 1998, pp. 94–99.

"Transition Density, A Stochastic Measure of Activity in Digital Circuits", Proc. 28$^{th}$ DAC, 1991, pp. 644–649.

Synopsys: Prime Power, Full–Chip Dynamic Power Analysis for Multimillion–Gate Designs, 2004.

* cited by examiner

Primary Examiner—Marc S. Hoff
Assistant Examiner—Mary Catherine Baran
(74) Attorney, Agent, or Firm—Pearne & Gordon LLP

(57) ABSTRACT

In contrast with a known dynamic gate-level simulation method, a method of analyzing electromagnetic interference (an EMI analysis method) according to the present invention enables estimation of EMI noise, by means of calculating signal propagation of each node through use of the signal propagation probability technique, and calculating variation time of each node through use of "the Static timing analysis technique". In short, the present invention is characterized in calculating a frequency characteristic from the relationship between toggle probability of each node and delay in each node.

11 Claims, 15 Drawing Sheets

FIG. 5A
DELAY INFORMATION
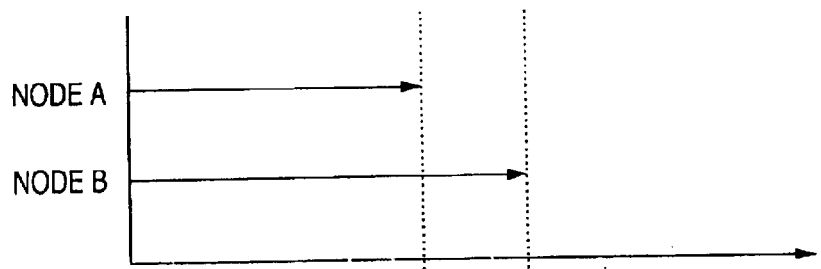
FIG. 5B
PROBABILITY INFORMATION
NODE A 50%   NODE B 80%
FIG. 5C
ELEMENT CURRENT WAVEFORM INFORMATION
NODE A   NODE B
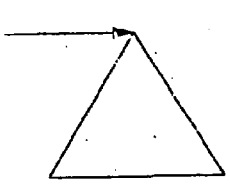 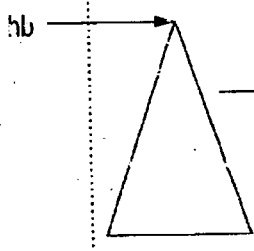
ha   hb
→ MULTIPLIED BY
↓
ADD INFORMATION TO DELAY TIME
FIG. 5D
AVERAGE CURRENT WAVEFORM INFORMATION
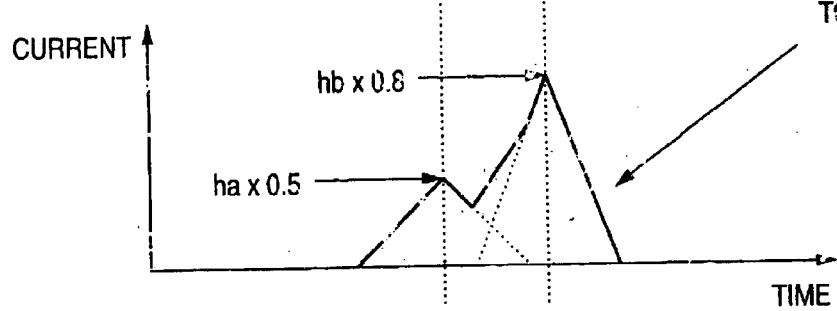
CURRENT
hb x 0.8
ha x 0.5
TIME

FIG. 8A
DELAY INFORMATION
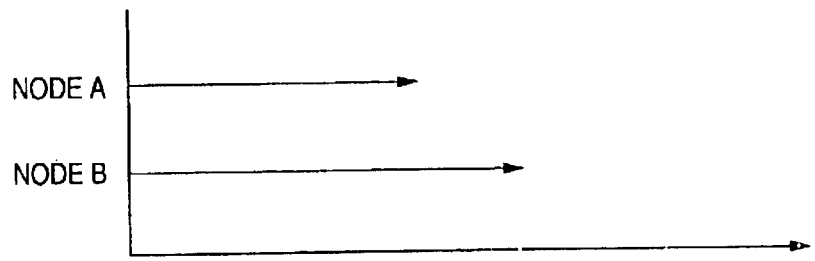
FIG. 8B
PROBABILITY INFORMATION
FIG. 8C
ELEMENT CURRENT WAVEFORM INFORMATION
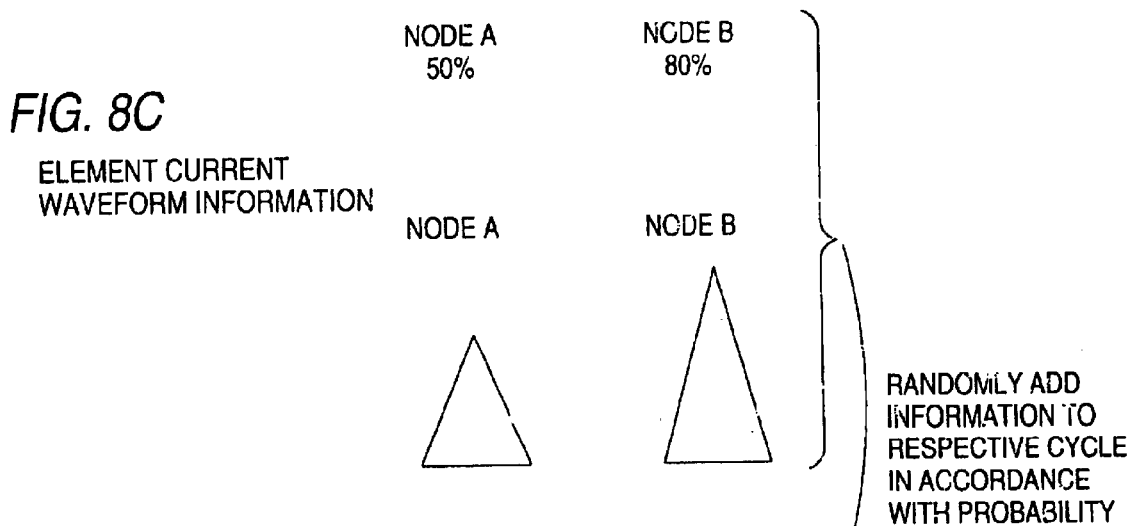
RANDOMLY ADD INFORMATION TO RESPECTIVE CYCLE IN ACCORDANCE WITH PROBABILITY
FIG. 8D
RANDOM CURRENT WAVEFORM INFORMATION
OPERATING FREQUENCY INFORMATION
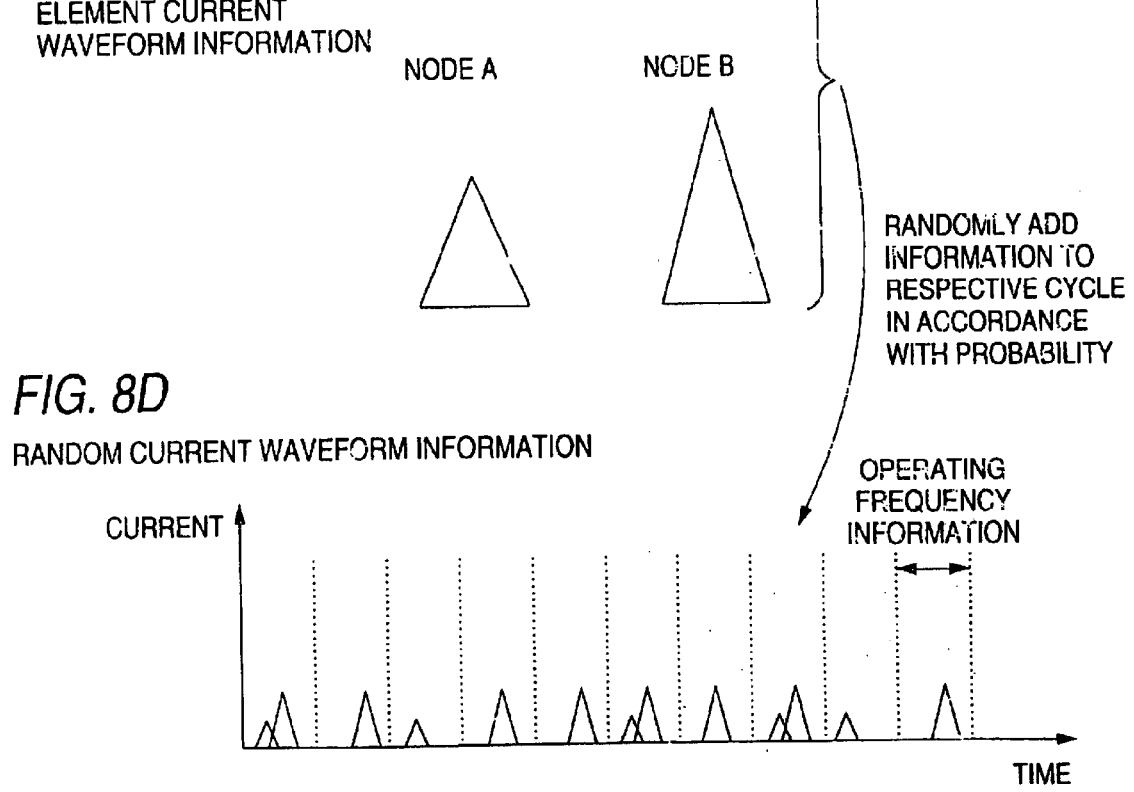

ADD DELAY AND TRANSITION
PROBABILITY INFORMATION
UNIQUE TO EACH OF PATHS
TO DELAY TRANSITION
PROBABILITY INFORMATION

DELAY/TRANSITION PROBABILITY INFORMATION

ELEMENT CURRENT WAVEFORM INFORMATION

AVERAGE CURRENT WAVEFORM INFORMATION

METHOD OF ANALYZING ELECTROMAGNETIC INTERFERENCE

BACKGROUND OF THE INVENTION

1. Field of the Invention

The present invention relates to a method of analyzing electromagnetic interference (EMI) (hereinafter often referred to as an "EMI analysis method"), and more particularly, to a method of analyzing electromagnetic interference arising in a large-scale, high-speed LSI (large-scale integrated circuit) by means of high-speed, highly accurate logic simulation.

2. Description of the Related Art

LSIs are used in a broadening range of applications, from communications devices, such as cellular phones, to general household products, toys, and automobiles, as well as applications in the field of computers. Electromagnetic interference arising in such products induces radio interference noise in a nearby RF receiver, such as a TV set or a radio, or in faulty operation of another nearby system. In order to prevent this problem, the whole product is shielded, or filters are provided in the product In order to reduce the need to increase the complexity and cost of production and to reduce the difficulties encountered in conventional methods of preventing occurrence of electromagnetic interference in a product, strong demand exists for a means of suppression of noise in an LSI itself.

An LSI is a key component of any product in which it is used. Demand exists for a larger-scale, high-speed LSI in order to ensure the competitiveness of a product. As product development cycles become shorter, design-automation of LSIs has become indispensable for satisfying the demand. There is a growing need for adopting synchronous circuitry in LSIs in order to take advantage of state-of-the-art design-automation methods. When all of the circuits of a large-scale, high-speed LSI operate synchronously with a reference dock signal, instantaneously-changing current becomes very large resulting in an increase in the induction of electromagnetic interference.

The present invention relates to a simulation method that enables evaluation of EMI indispensable for reducing electromagnetic interference while maintaining a tendency toward a larger-scale, higher-speed LSI.

Noise imposed on another device by an LSI is roughly classified into two types: radiation noise, and conduction noise. Radiation noise emanated directly from an LSI includes noise emitted from internal wires of an LSI. However, the internal wires are not large enough to act as an effective antenna. As operating frequencies of LSIs continue to increase, it is expected that the radiation noise emitted directly from an LSI will pose a problem in the future. However, as of now, the noise emitted from the inside of an LSI is considered trivial.

In contrast, conduction noise from an LSI affects other devices mounted on the same printed circuit board, by way of direct interconnections, such as external leads of the LSI or traces provided on the printed circuit board. The interconnections act as the source of origination or as an antenna for emitting conduction noise. The antenna constituted of the interconnections is much larger than that constituted by internal wires of an LSI and is a dominant element In terms of electromagnetic emission.

A power line and a signal line can act as paths along which conduction noise developing in an LSI travels. When analyzing an electromagnetic field in the vicinity of an LSI, noise which results from variation in an electric current of a power source being emitted from a power line serving as an antenna is considered to be dominant. In some cases, ringing and overshoot phenomena stemming from variation in a signal may also pose problems. However, variation in an internal power level of an LSI that propagates as a signal waveform more often presents a problem. Noise emitted from a power line or a signal line is considered to have a strong correlation with variation in the electric current of a power source (hereinafter referred to as a "source current").

A source current of a CMOS circuit will now be described by reference to a simple inverter circuit. When variation arises in a voltage applied to an inverter circuit, a load capacity charge/discharge current flows, which is the primary source current of the CMOS circuit. In addition, a short circuit current flows together with the load capacity charge/discharge current. In automated design of such a CMOS circuit, all circuits of an LSI are synchronized In accordance with the constraints of the design-automation tool. As a result of all circuits being synchronized, all circuits of the LSI operate simultaneously, and a peak current arises in a power source in synchronism with a reference clock signal. Further, in order to increase operating speed, or shorten a cycle, of the LSI, the capacity of a transistor is increased so as to enable a charging/discharging operation to be completed within a shorter period of time. Eventually, the peak current increases. Necessarily, the total source current of an LSI is increased when the integration level of an LSI is increased. Thus, the peak current of the power source is increased, thereby inducing an abrupt change in source current. Such an abrupt change induces an increase in higher harmonic components, thereby resulting in an increase in electromagnetic interference.

Highly precise simulation of change in a source current, the primary cause of electromagnetic interference, is considered to be effective in predicting the electromagnetic interference that will arise in an LSI.

A conventional current simulation method for transistor-level current analysis will be described below.

FIG. 15 is a block diagram showing the flow of processing operations of a conventional transistor-level EMI analysis method. According to this method, based on layout data is provided O1 that describes an LSI that is to be analyzed using a transistor-level current analysis method. Layout parameter extraction (hereinafter referred to simply as an "LPE") processing O3 is performed on the layout data. Subsequently, several processing steps are performed: circuit simulation O6 of a switch-level netlist; source-of-current modeling O8; a power line LPE step O10; transient analysis simulation O12; and fast Fourier transformation (hereinafter abbreviated FFT) processing O14.

Processing pertaining to each of the foregoing processing steps will now be described with reference to FIG. 15.

First, in step O3 data is input: layout data O1 pertaining to a semiconductor integrated circuit to be subjected to EMI analysis; parameters of elements, such as transistor elements or various parasitic wiring elements (e.g., resistors and capacitors); and an LPE rule O2 for defining a form in which extracted layout parameters are to be output. In accordance with the LPE rule O2, parameters of the respective elements included In the layout data O1 are calculated, whereby a netlist O4 is produced. In step O3, parasitic elements of a power source (and the ground) are not extracted.

In step O6 the netlist O4 prepared in step O3 and a test pattern O5 are input. The test pattern is used for causing the circuit being analyzed to replicate a desired logic operation. A load capacity charge/discharge current and a short circuit current are calculated, which correspond to the operating state of an internal circuit, thereby producing current waveform information O7 about the waveform of an electric current of a transistor. The processing of step O6 is based on the assumption that the potential of a power source (and that of ground) is a variation-free, ideal potential.

In step O8 the current waveform information O7 of a transistor prepared in step O6 is entered. The current waveform information O7 is used to prepare current source element model information O9 suitable for subsequent step O12. In order to reduce the processing load for subsequent step O12, a function circuit block consisting of a plurality of transistors is usually modeled as a single current-source element.

The processing performed in step O10 differs from step O3, only in that parameters of parasitic elements of a power source and of a ground wire (e.g., resistors, decoupling capacitance, and like elements) are extracted, rather than parameters of transistor elements and of various parasitic wiring elements. Hence, repeated explanation is omitted. In step O10, a power source (and ground) wiring netlist O11 is produced.

In step O12 the current source element model information O9 prepared in step O8 is entered, the power source (and ground) wiring netlist O11 prepared in step O10 is entered, and impedance O16 of a wire or a lead frame (including, resistance, capacitance, and inductance) is entered. Through analysis of these input data carried out by a transient analysis simulator typified by SPICE, fluctuations in line voltage of a subject circuit are calculated. Thus, a line voltage drop result O17 is produced which corresponds to these fluctuations in line voltage.

Subsequently, the processing of step O6 is performed again. In contrast with the first operation of the processing of step O6 which was based on the assumption that the potential of the power source (and the ground) is a fluctuation-free, ideal potential, the line voltage drop result O17 prepared in step O12 is entered. The current waveform information O7 for a transistor is prepared again with consideration of fluctuations in line voltage. Similarly, processing of steps O8 and O12 is repeated.

Steps O6, O8, and O12 are repeated several times, thereby producing a current waveform result O13 that very accurately simulates fluctuations in line voltage.

In step O14, the current waveform result O13 prepared in step O12 is entered and subjected to FFT processing, to thereby enable frequency spectrum analysis. Thus, an EMI analysis result O15 is obtained.

In the conventional example, the precision of verification varies greatly according to the combination of the LPE processing O3, the power line LPE processing O10, and the source current modeling processing O8. However, a certain level of accuracy of analysis can be expected. A transient analysis simulator typified by SPICE is limited to transistor-level analysis of an electric current and thus, an enormous amount of processing time is required. Since the integration level of semiconductor integrated circuits has increased recently, establishment of an EMI analysis method is desired to enable high-speed analysis of an electric current on a higher level than a transistor level A gate-level current analysis method has conventionally been proposed as a current analysis method that can be made faster. This gate-level current analysis method is used for analyzing power consumption. One example of a gate-level current analysis method is EMI-noise analysis that is performed in an ASIC design environment. This method is described in "EMI-Noise Analysis Under ASIC Design Environment" (ISPD&99, pp. 16 through 21). According to this technique, an event is acquired from the result of a gate-level simulation using a test vector, and the waveform of an electric current is estimated. The frequency of the thus-estimated current waveform is analyzed using FFT processing. More specifically, as shown in FIG. 16, a logic simulation 104 is based on a netlist 101 and a test vector 102, wherewith event information 105 is calculated. Based on this event information 105 and on waveform information 103 obtained at the time of toggling, processing for a current waveform calculation section 107 is executed, producing a current waveform calculation result 108. This current waveform calculation result 108 is subjected to FFT processing 109 to produce a frequency characteristic 110. The EMI-noise analysis method can perform an EMI analysis operation faster than the conventional gate-level EMI analysis method. However, use of a test vector still involves consumption of substantial execution time. Therefore, the processing speed achieved by the aforementioned EMI-noise analysis method is not sufficiently high, and demand still exists for faster EMI-noise analysis method. Another problem with the aforementioned EMI-noise analysis method is that the analysis result is dependent on the pattern of the test vector employed.

As mentioned above, the conventional example using the transistor-level current analysis method can be expected to yield a certain level of accuracy. However, a transient analysis simulator typified by SPICE is used for such a transistor-level current analysis. As such, a limitation is imposed on the level of a circuit to be analyzed, and an enormous amount of processing time is required. The level of semiconductor integrated circuits has recently increased, and thus there is a need for an EMI analysis method that enables high-speed analysis of an electric current at a scale larger than that which can be analyzed by a transistor-level simulator.

Gate-level simulation using a test vector has also been proposed. However, the example conventional gate-level simulation technique does not sufficiently increase the speed of analysis. Since the gate-level simulation technique employs a test vector, an analysis result is dependent on the test pattern employed.

SUMMARY OF THE INVENTION

The present invention has been conceived to solve the drawbacks of the conventional methods and is aimed at evaluating electromagnetic interference developing in an LSI through a simulation by means of high-speed, highly accurate analysis of a power-supply current.

To this end, the present invention provides a method of analyzing electromagnetic interference (an EMI analysis method). In contrast with the known dynamic gate-level simulation method, the present EMI analysis method enables estimation of EMI noise by means of calculating signal propagation of each node using the signal propagation probability technique, and calculating variation time of each node using "the Static timing analysis technique". In short, the present invention involves calculating a frequency characteristic from the relationship between toggle probability of each node and delay in each node.

More specifically, the present invention provides a method of analyzing electromagnetic interference developing in an LSI, comprising:

a correction step of correcting the amplitude of a current estimation waveform in each node which has been previously prepared for each change in each node, in accordance with the probability of variation in each node;

an addition step of adding current waveforms of all nodes together within a period of time corresponding to one cycle, provided that the thus-corrected current waveform appears at a time a signal arrives at each node; and a frequency analysis step of analyzing the frequency of the current waveform calculated in the addition step.

The probability of variation in each node is calculated using the signal propagation probability technique. Further, the time at which a signal arrives at each node is calculated using the static timing analysis technique. The time at which a signal arrives is defined so as to fall within the range between the maximum time and the minimum time, in accordance with an average time, the maximum time, the minimum time, or a predetermined distribution such as a normal distribution.

Preferably, in the correction step, the amplitude of a current estimation waveform, which has been prepared for each change in each node, is corrected in accordance with the probability of variation in each node and a distribution with respect to time (hereinafter called "chronological distribution").

More specifically, the probability of change in each node is calculated using the signal propagation probability technique, and the chronological distribution at which a signal arrives at each node is calculated using the static timing analysis technique.

Preferably, each node has a plurality of paths, and a current waveform is calculated based on a case where each of the paths has a unique probability of change and signal arrival time.

Further, the present Invention provides a method of analyzing electromagnetic interference developing in an LSI, the method comprising:

a waveform formation step of forming a current estimation waveform which has been prepared for each change in each node, as if the waveform randomly arises within a plurality of predetermined cycles, in accordance with the probability of change in each node and a time at which a signal arrives at each node;

adding the thus-prepared current estimation waveforms of all nodes, to thereby derive a current waveform; and analyzing the frequency of the current waveform, thereby determining a noise characteristic of EMI.

In other words, under the EMI analysis method according to the present invention, the probability of change in each node is calculated using the signal propagation probability technique, and the result of calculation is stored as a probability at which a signal randomly changes. Further, a time at which a signal arrives at each node is calculated using the static timing analysis technique.

Moreover, the present invention provides a method of analyzing electromagnetic interference developing in an LSI, the method comprising:

a waveform formation step of forming a current estimation waveform which has been prepared for each change in each node, as if the waveform randomly arises within a plurality of predetermined cycles, in accordance with the probability of change in each node and chronological distribution probability;

adding the thus-prepared current estimation waveforms of all nodes, to thereby derive a current waveform; and analyzing the frequency of the current waveform, thereby determining a noise characteristic of EMI.

More specifically, the probability of change in each node is calculated using the signal propagation probability technique, and the result of calculation is stored as the probability of a signal changing randomly. A chronological distribution at which a signal arrives at each node is calculated using the static timing analysis technique.

Preferably, each node has a plurality of paths, and a current waveform is calculated based on a case where each of the paths has a unique probability of change and signal arrival time.

BRIEF DESCRIPTION OF THE DRAWINGS

FIGS. 5A to 5D are illustrations showing a processing image according to the first embodiment of the present invention;

FIGS. 8A through 8D are illustrations showing a processing image pertaining to the second embodiment;

DESCRIPTION OF THE PREFERRED EMBODIMENTS

Figure 1:
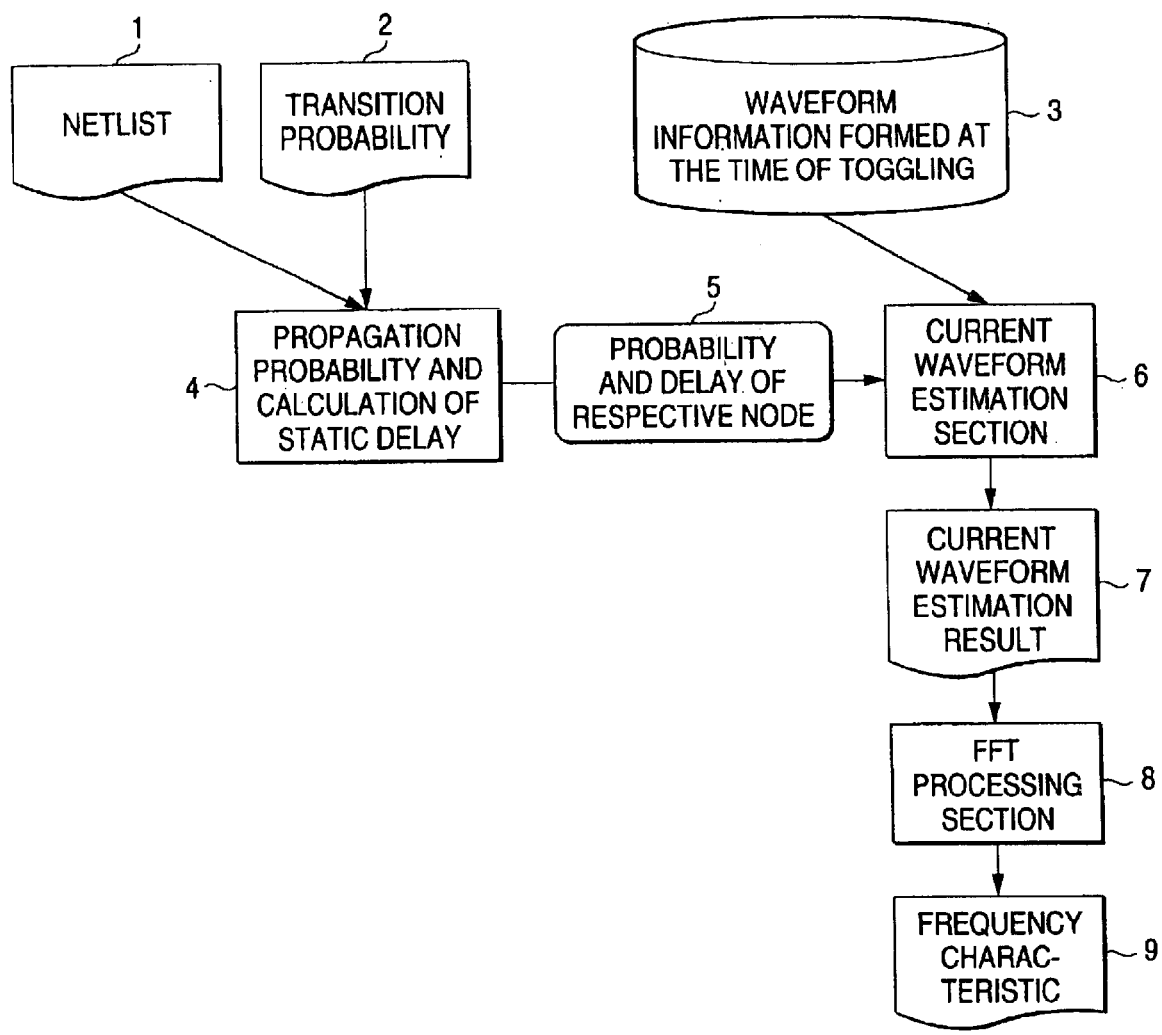
FIG. 1 is a schematic illustration of the concept of the present invention.

An electromagnetic interference analysis method according to preferred embodiments of the present invention will now be described with reference to the accompanying drawings. As shown in FIG. 1, an EMI analysis method according to the present invention comprises:

calculating the transition probability of a node from a netlist 1 and a transition probability 2 using a propagation probability method, and calculating a static delay 4 using a static delay analysis method, to thereby derive a calculated probability/delay 5 of the node;

estimating the waveform 6 of an electric current based on the probability/delay 5 and information 3 about the waveform of an electric signal at the time of toggling, to thereby derive a current waveform estimation result 7; and subjecting the current waveform estimation result 7 to a fast Fourier transformation (FFT) 8, thereby determining a frequency characteristic of the waveform.

First Embodiment

Figure 2:
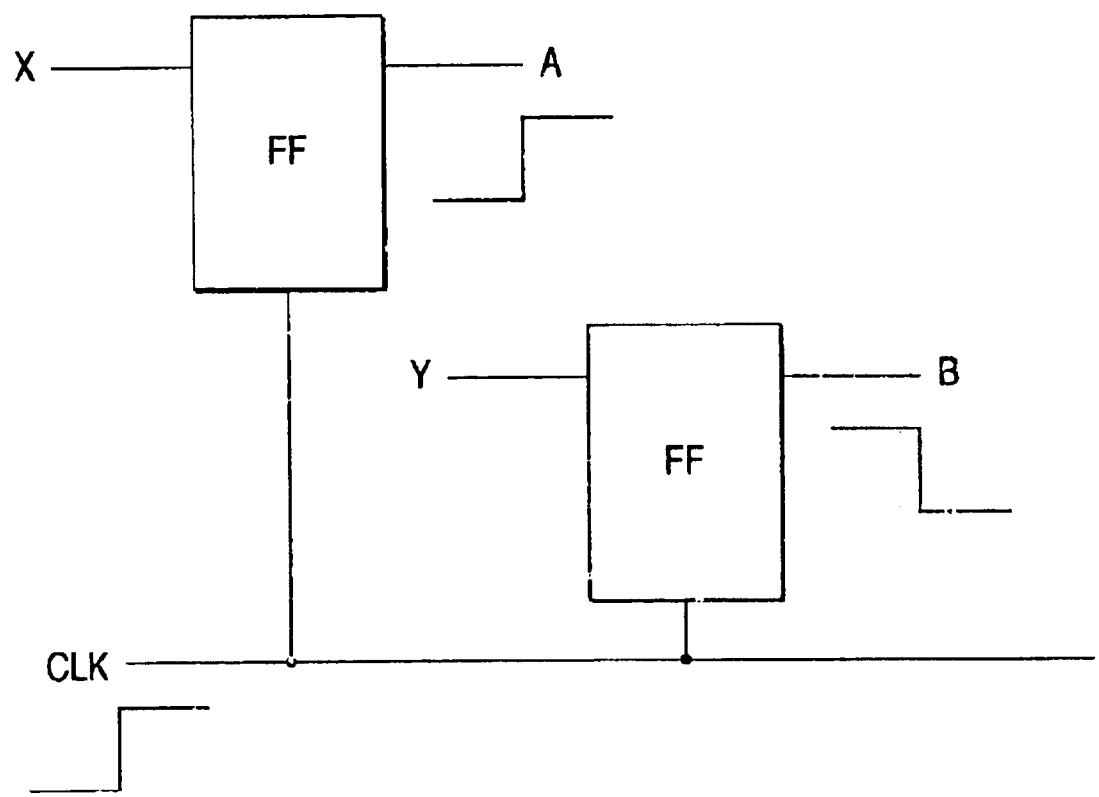
FIG. 2 is a block diagram showing a portion of a circuit used in a first embodiment of the present invention.
Figure 3A:
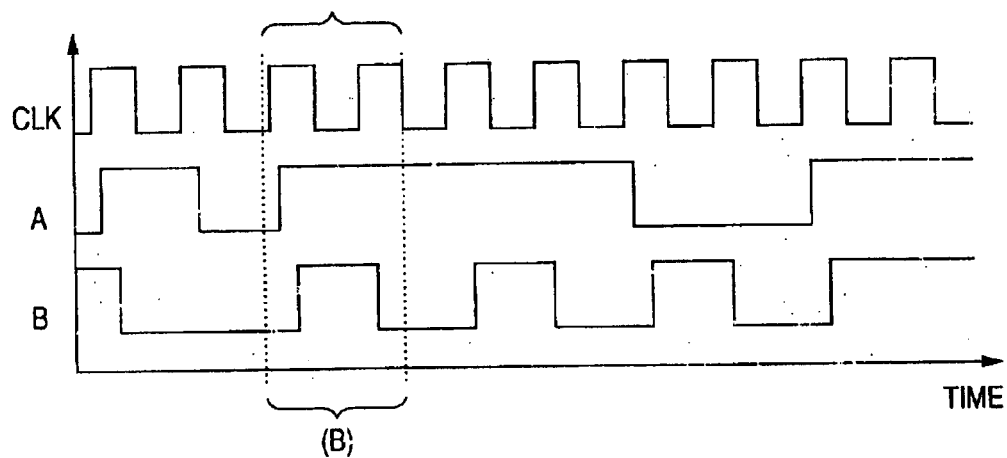
FIGS. 3A and 3B are graphs showing waveforms of signals arriving at the respective nodes of the cell shown in FIG. 2.
Figure 3B:
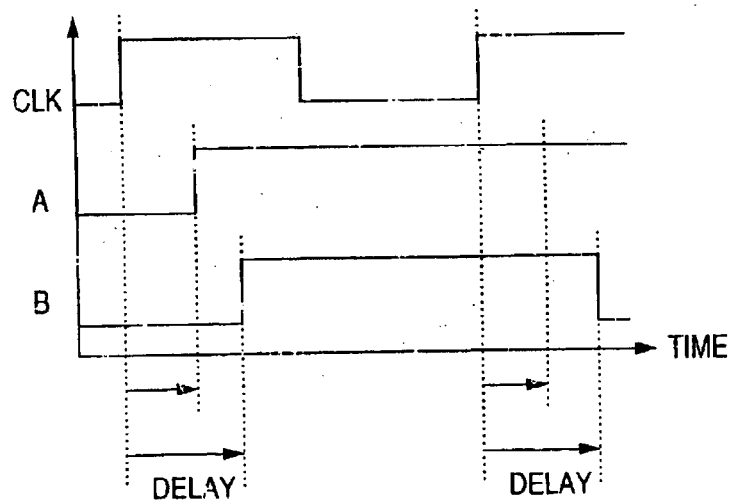

A method of analyzing electromagnetic interference according to a first embodiment of the present invention will be described hereinbelow. The schematic diagram shown in FIG. 1, shows an EMI analysis method according to the first embodiment. The quantity of electromagnetic interference developing in an LSI is analyzed based on a transient probability and static delay propagation data. A waveform shown in FIG. 3A appears at a node A of a flip-flop (FF) cell and a waveform shown in FIG. 3B appears at a node B of the FF cell when a clock signal CLK is input to a circuit shown in FIG. 2 (where FIG. 3B is an enlarged view of about 1.5 cycles of the signal designated by braces in FIG. 3A). Here, the transition probability of a node is calculated from a previously prepared netlist 1 and a transition probability 2. Further, a static delay 4 in a current estimation waveform per change is calculated. The amplitude of a current waveform is corrected based on information 3 about the waveform of an electric current arising at the time of a predetermined toggling operation. Provided that the corrected current waveform arises at a time at which a signal arrives at the respective node, the current waveforms which appear at all nodes during a period of time corresponding to one cycle are added to the current waveform (the current waveform estimation processing 6). The current waveform estimation result 7 determined through addition is subjected to the FFT processing 8, thereby determining the frequency characteristic 9 of EMI components of a circuit to be analyzed.

Figure 4:
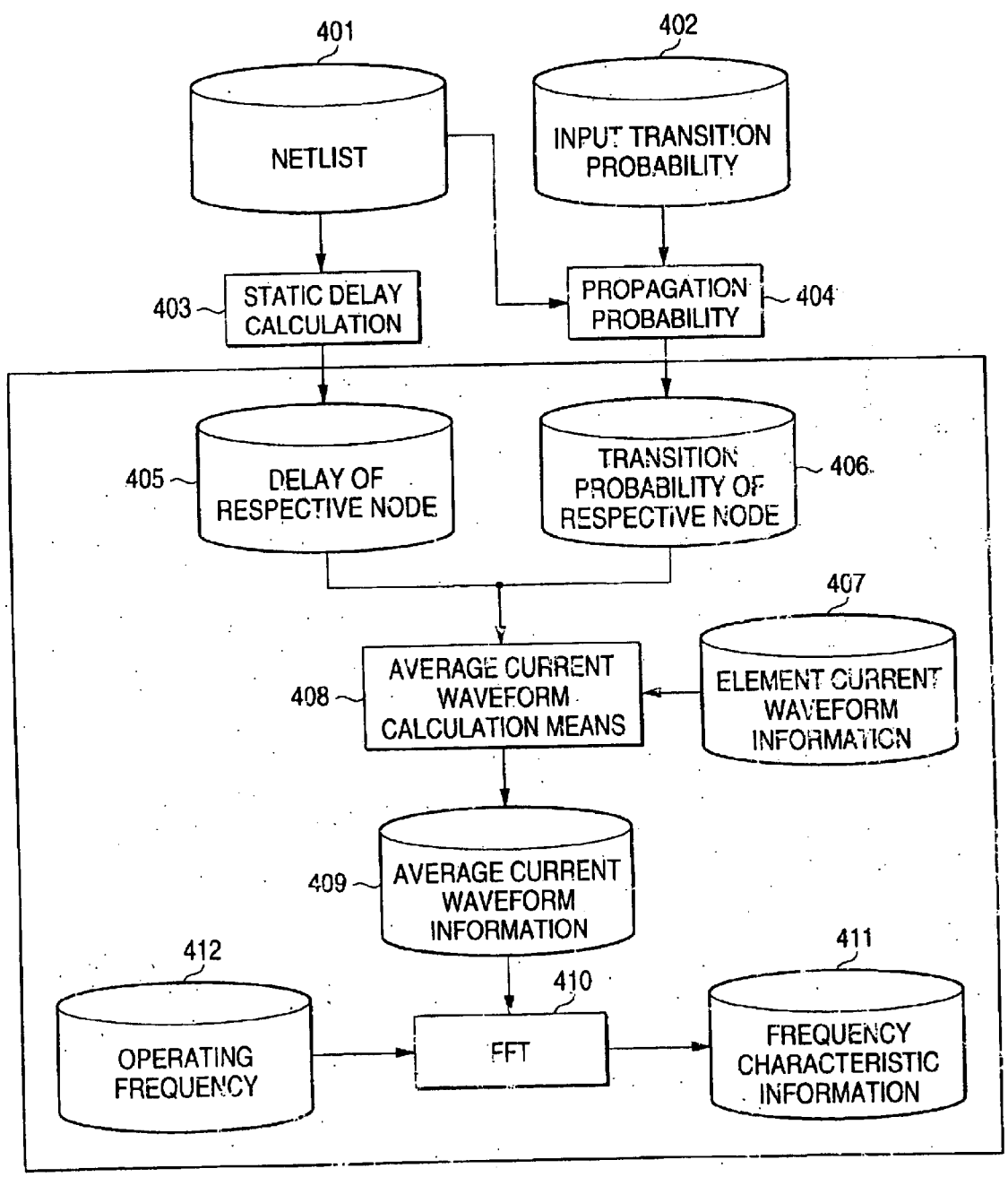
FIG. 4 is a block diagram showing the processing of a frequency characteristic calculation block according to a first embodiment of the present invention.

FIG. 4 is a block diagram showing the overall processing flow of the EMI analysis method according to the first embodiment. FIGS. 5A through 5D are illustrations showing the principle underlying the processing. In a netlist 401, a circuit, which is the subject of the EMI analysis, is represented as circuit data. Delay information 405 for each node is derived from the netlist 401 using static delay calculation 403 (see FIG. 5A). Transition probability information 406 for each node is derived from both the netlist 401 and input transition probability 402 using propagation probability 404 (see FIG. 5B). Based on a triangular waveform whose area corresponds to the quantity of electric current derived by means of multiplying current waveform information by probability information, the average current waveform calculation means 408 derives an average current waveform 409 from element current waveform information 407 for each node (see FIG. 5C) and the delay information 405. The thus-determined average current waveform 409 is used as average current waveform information (see FIG. 5D). The average current waveform information is subjected to FFT processing 410, thereby deriving frequency characteristic information 411.

Figure 6:
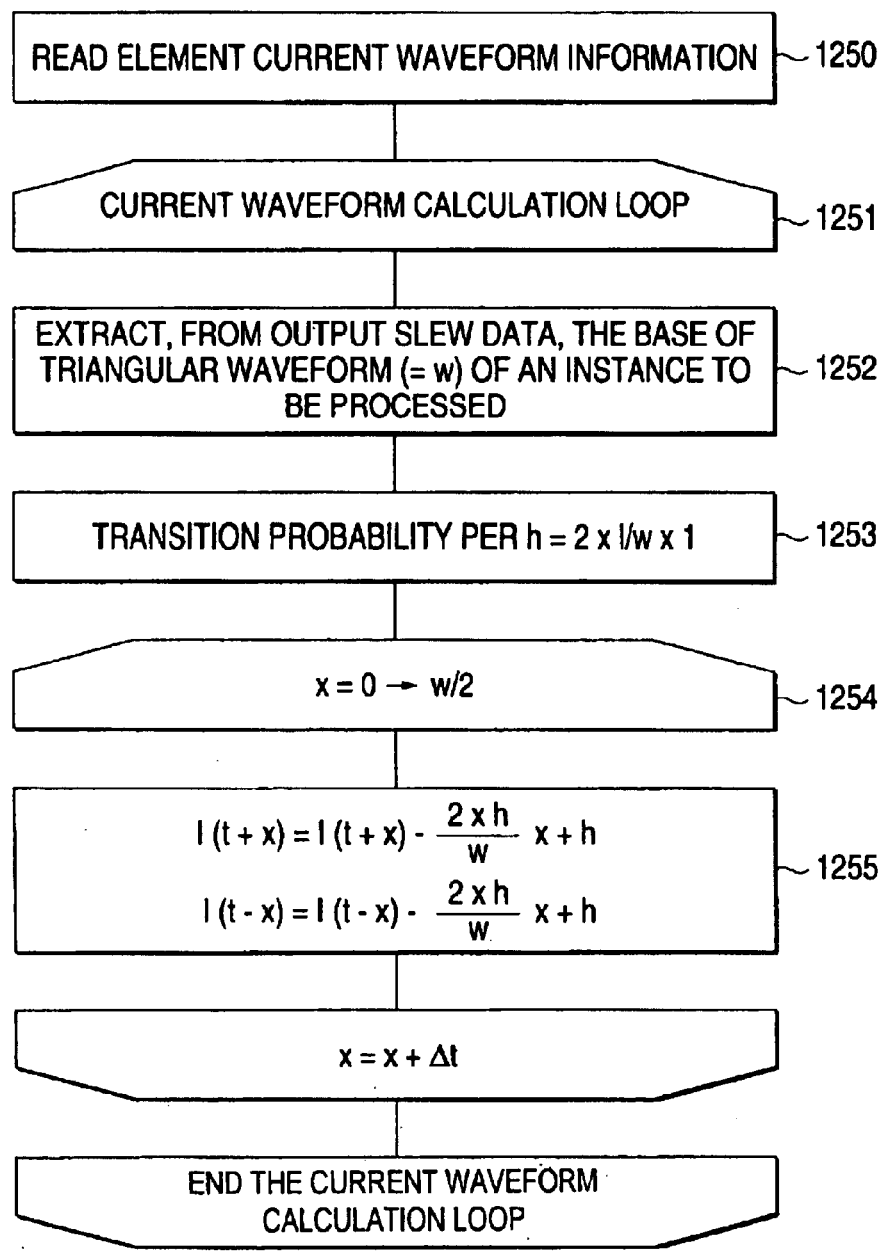
FIG. 6 is a flowchart of processing of a current waveform calculation according to the first embodiment.

FIG. 6 shows a flowchart of processing performed by the average current waveform calculation means 408. The average current waveform calculation means 408 reads element current waveform information from a table (step 1250) and performs a current waveform calculation loop (step 1251). The base, W, of a triangular waveform of an instance to be processed is extracted from an output slew (step 1252). The area of the triangular waveform is derived by multiplying W×h/2 by transition probability per cycle, and I is taken as the value of the area of the triangular waveform. The height, h, of the triangular waveform is calculated from transition probability per $$\frac{2 \times I}{W \times 1}$$

cycle (step 1253), wherein I denotes the quantity of electric current flowing in a cell of an event being processed. This processing corresponds to processing performed by a triangular waveform shaping section. Until x changes from 0 to W/2, h(c, i) is added to I(t+x) and I(t−x). Further, Δt is added to x (steps 1254 and 1255). Here, I(t+x) denotes total electric current flowing through all the cells at time t+x, and I(t−x) denotes total electric current flowing through all the cells at time t−x.

The frequency characteristic of a subject circuit can be determined in the manner as mentioned previously, and a designer can analyze EMI that would arise in a circuit of interest.

According to the EMI analysis method, a current waveform is modeled through an averaging operation based on static delay information and propagation probability information. The thus-obtained model is subjected to FFT processing, thereby analyzing EMI of a circuit. The EMI analysis method can analyze EMI components within a shorter period of time than a known gate-level dynamic analysis method can.

When EMI analysis for each path of a circuit is desired, static delay information for each path is given.

In the first embodiment, electric currents of all nodes in a subject circuit are added. However, if the number of nodes whose electric currents are to be added is adjusted, as appropriate for the magnitude of an electric current or the frequency of probability, processing time can be shortened further.

Second Embodiment

Figure 7:
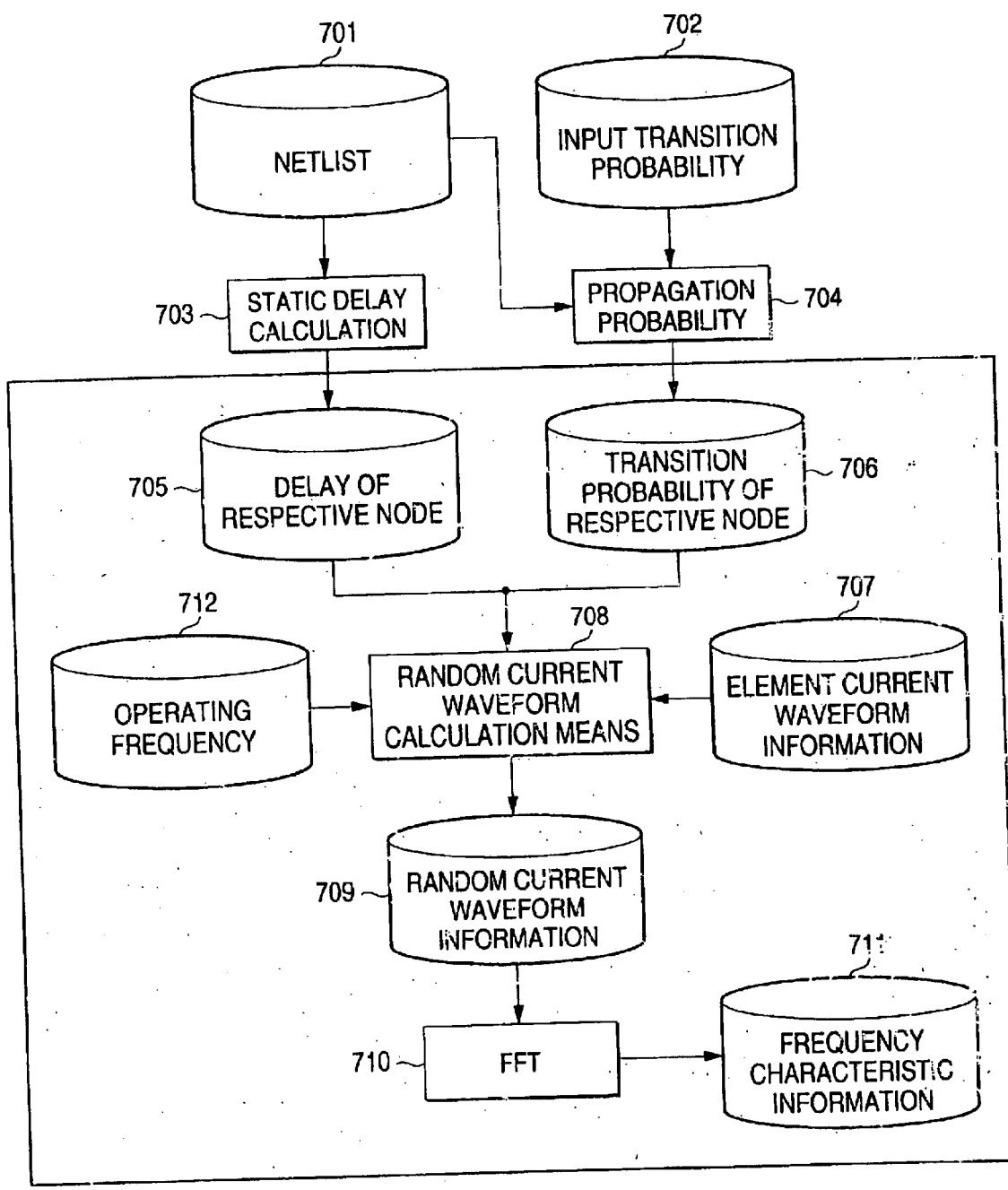
FIG. 7 is a block diagram showing the processing of a frequency characteristic calculation block according to a second embodiment or the present invention.

Next, an EMI analysis method according to a second embodiment of the present invention will be described. In the second embodiment, as shown in the flowchart of FIG. 7, random current waveform estimation means 708 is used in lieu of the average current waveform calculation means 408 of the first embodiment, and random current waveform information is used in lieu of the average current waveform information. In other respects, the EMI analysis method according to the present embodiment is identical in configuration with that described in connection with the first embodiment.

FIG. 7 is a block diagram showing the overall flow of processing of the EMI analysis method according to the second embodiment. FIGS. 8A through 8D are illustrations showing the principle underlying the processing. In a netlist 701, a circuit, which is the subject of EMI analysis, is represented as circuit data. Delay information 705 for each node is derived from the netlist 701 using static delay calculation 703 (see FIG. 8A). Transition probability information 706 for each node is derived from the netlist 701 and input transition probability 702 using propagation probability 704 (see FIG. 8B). Based on element current waveform information 707 for each node (FIG. 8C) and operating frequency information 712, random current waveform estimation means 708 produces random current waveform information 709 (see FIG. 8D) within a plurality of predetermined cycles. The thus-produced random current waveform information 709 is subjected to FFT processing 710, thereby deriving frequency characteristic information 711.

Figure 9:
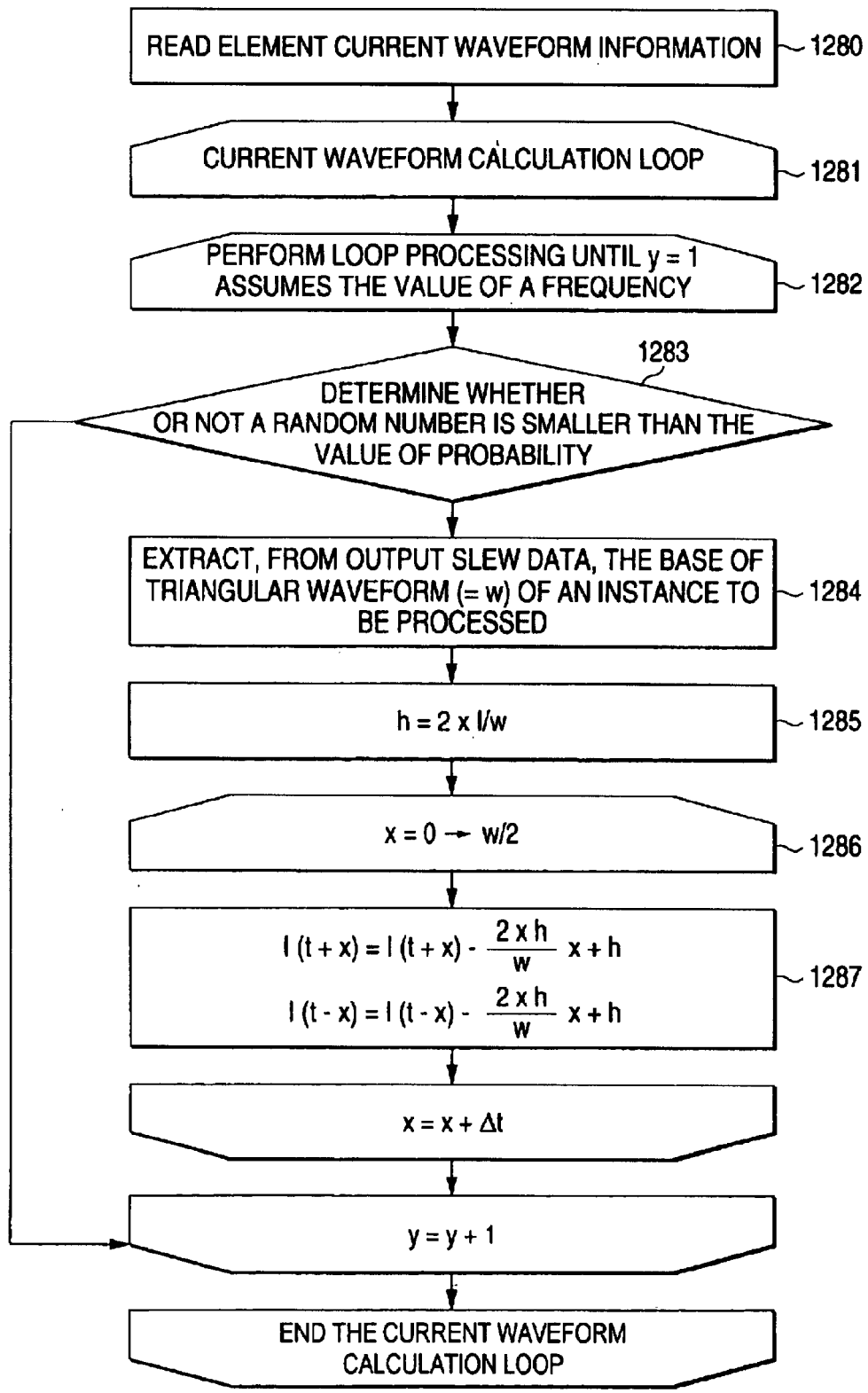
FIG. 9 is a flowchart of processing of a current waveform calculation according to the second embodiment.

FIG. 9 shows a flowchart of processing by the random current waveform estimation means 708. The average current waveform estimation means 708 reads element current waveform information from a table (step 1280) and performs a current waveform calculation loop (step 1281). The average current waveform estimation means 708 performs loop processing until the value of y (initially 1) reaches a given frequency. (step 1282). The following processing is iterated until calculation of a current waveform is completed. A determination is made as to whether a random number is smaller than the value of probability (step 1283). If a random number is smaller, the base of a triangular waveform of an instance to be processed is extracted from an output slew (step 1284). At this time, the area of the triangular waveform is defined as W×h/2, and I is the value of the area of the triangular waveform. The height h of the triangular waveform is calculated by 2×1/W (step 1285), wherein I denotes the quantity of electric current flowing in a cell of an event, which is the subject of processing. This processing corresponds to processing performed by a triangular waveform shaping section.

Until the value of x (initially 0) reaches W/2, h(c, i) is repeatedly added to I(t+x) and I(t−x). Further, Dt is added to x (steps 1286 and 1287). Here, I(t+x) denotes total electric current flowing through all the cells at time t+x, and I(t−x) denotes total electric current flowing through all the cells at time t−x.

The frequency characteristic of a subject circuit can be determined in the manner previously mentioned, and a designer can analyze EMI that would arise in a circuit of interest.

According to the present EMI analysis method, a current waveform is modeled using a random current waveform operation based on static delay information and propagation probability information The thus-obtained model is subjected to FFT processing, thereby analyzing EMI of a circuit. The EMI analysis method can analyze EMI components with high accuracy in a shorter period of time than a known gate-level dynamic analysis method.

When performance of EMI analysis for each path of a circuit is desired, static delay information for each path is given.

In the second embodiment, electric current information for all nodes in a subject circuit are added. However, if the number of nodes whose electric currents are to be added is adjusted, as appropriate for the magnitude of an electric current or the frequency of probability, processing time can be shortened further.

Third Embodiment

An EMI analysis method according to a third embodiment of the present invention will now be described. In the previously described first and second embodiments, delay information and probability information are prepared separately. Information is derived by means of multiplying waveform information, which is obtained as element current waveform information, by probability information. The thus-obtained information is added to a delay time of each node. In contrast, in the third embodiment, delay propagation probability information is derived from delay propagation probability information. Delay/transition probability is calculated from the delay propagation probability information, and element waveform information is added to the thus-calculated delay/transition probability.

Figure 10:
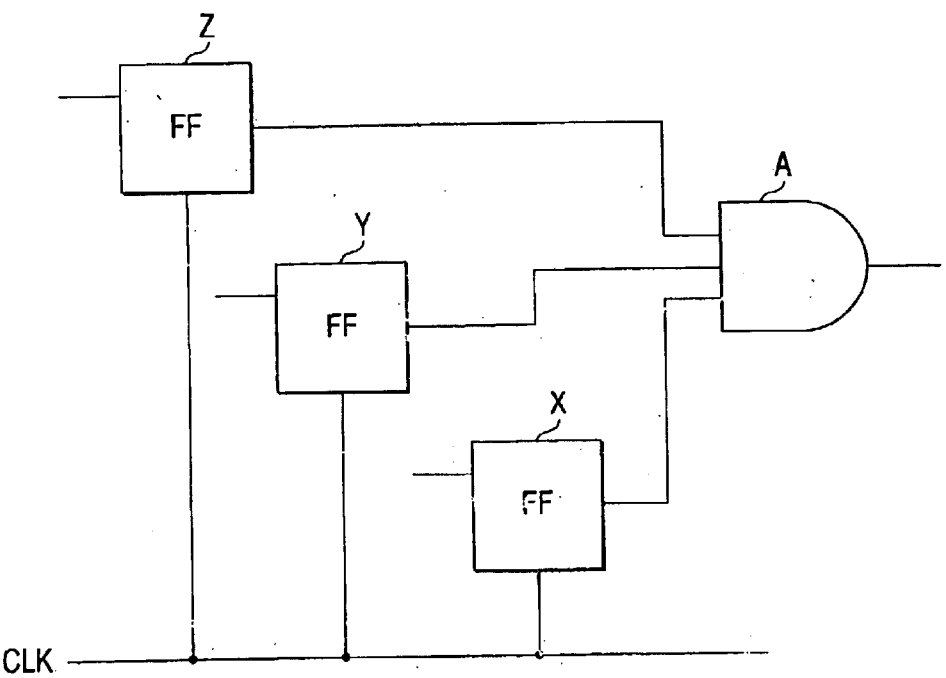
FIG. 10 is a block diagram showing a portion of a circuit used in a third embodiment of the present invention.
Figure 11:
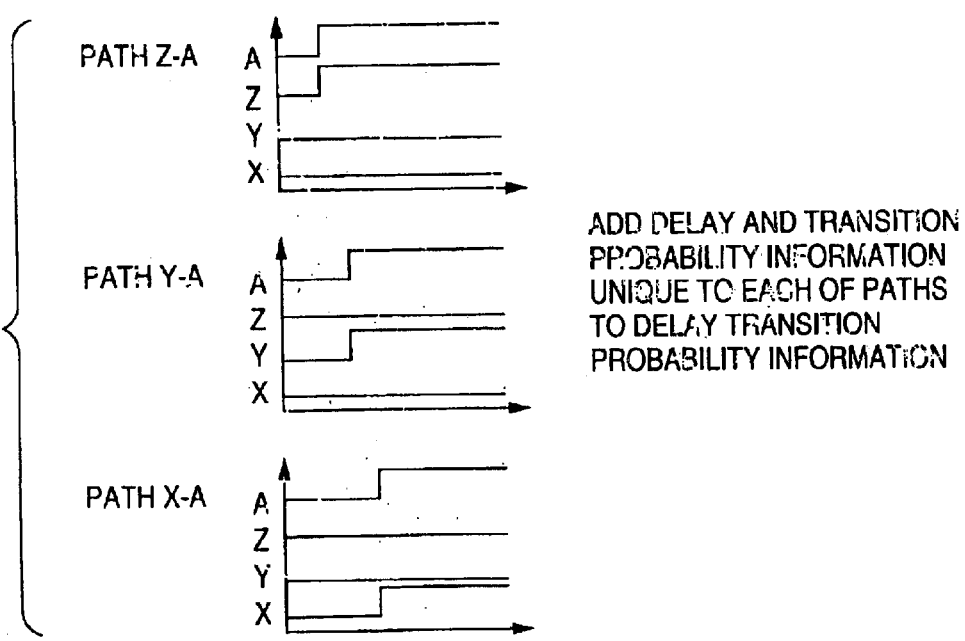
FIG. 11 is a graph showing signal waveforms of each path.

In this way, more realistic current waveform information is calculated. The result of this current waveform calculation is subjected to FFT processing, thereby determining the frequency characteristic of an EMI component of a circuit to be analyzed. Thus, EMI of the circuit is analyzed. As can be seen from an enlarged view shown in FIG. 10, the present embodiment is directed particularly to a case where a plurality of paths is are provided in a composite cell. FIG. 11 shows delay transition information concerning propagation of a signal in each of the paths of the composite cell shown in FIG. 10. FIG. 11 shows delay transition probability information as one example. As can be seen from FIG. 11, node information is obtained for a plurality of paths, and mean current waveform information is derived from the node information.

Figure 12:
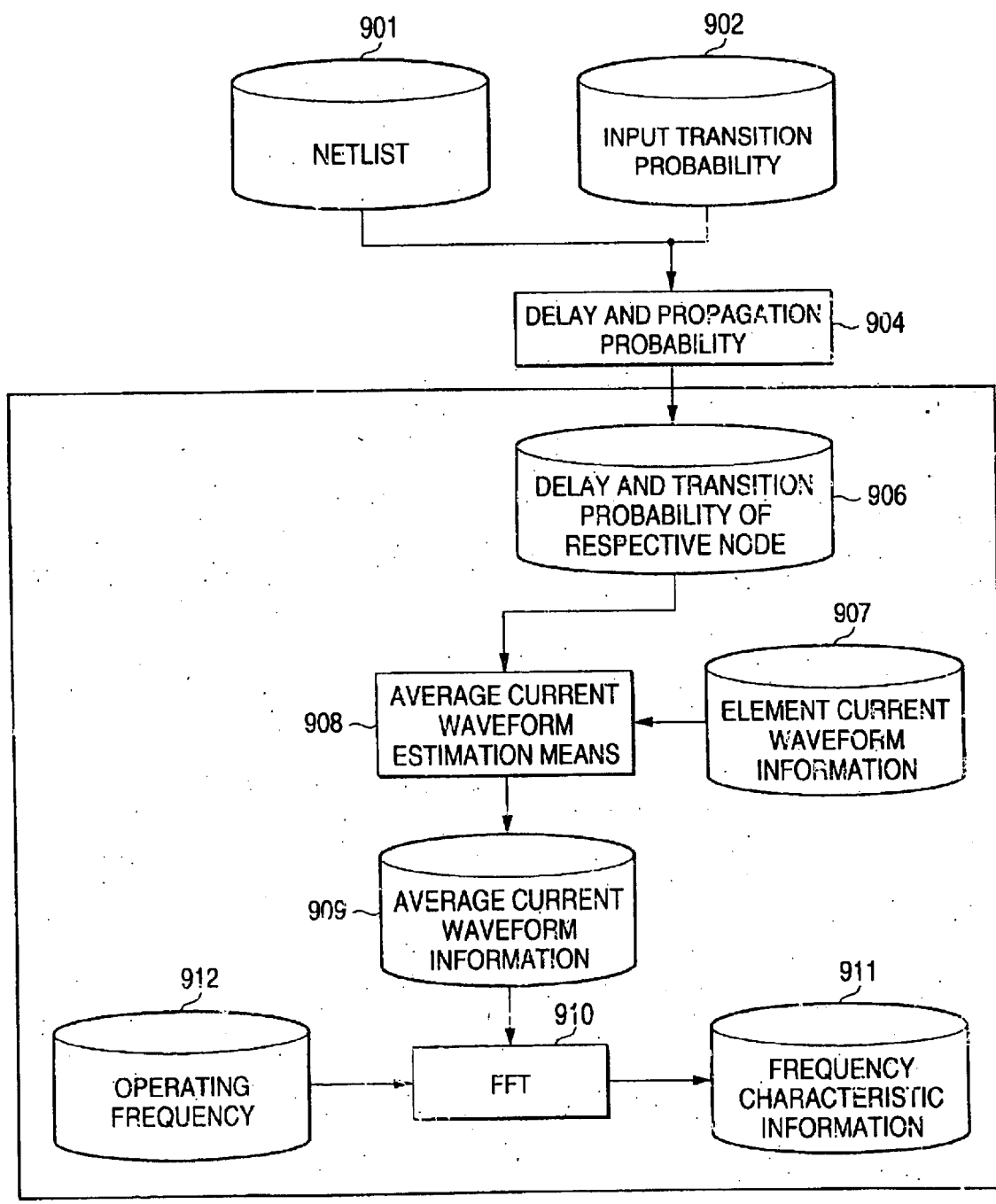
FIG. 12 is a block diagram showing a frequency characteristic calculation block according to a third embodiment of the present invention.
Figure 13A:
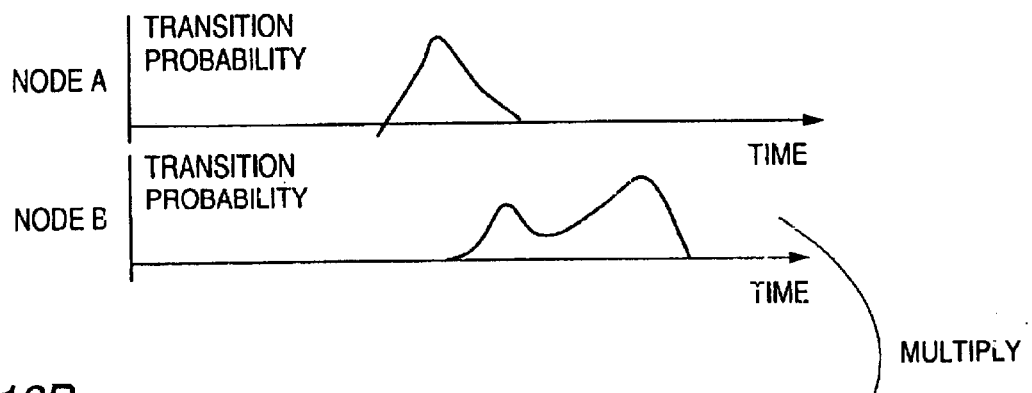
FIGS. 13A through 13C are illustrations showing a processing pertaining image to the third embodiment.
Figure 13B:
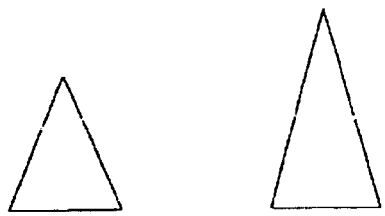
Figure 13C:
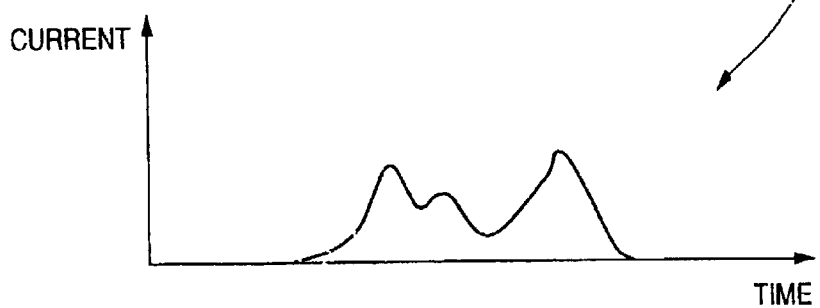
Figure 14:
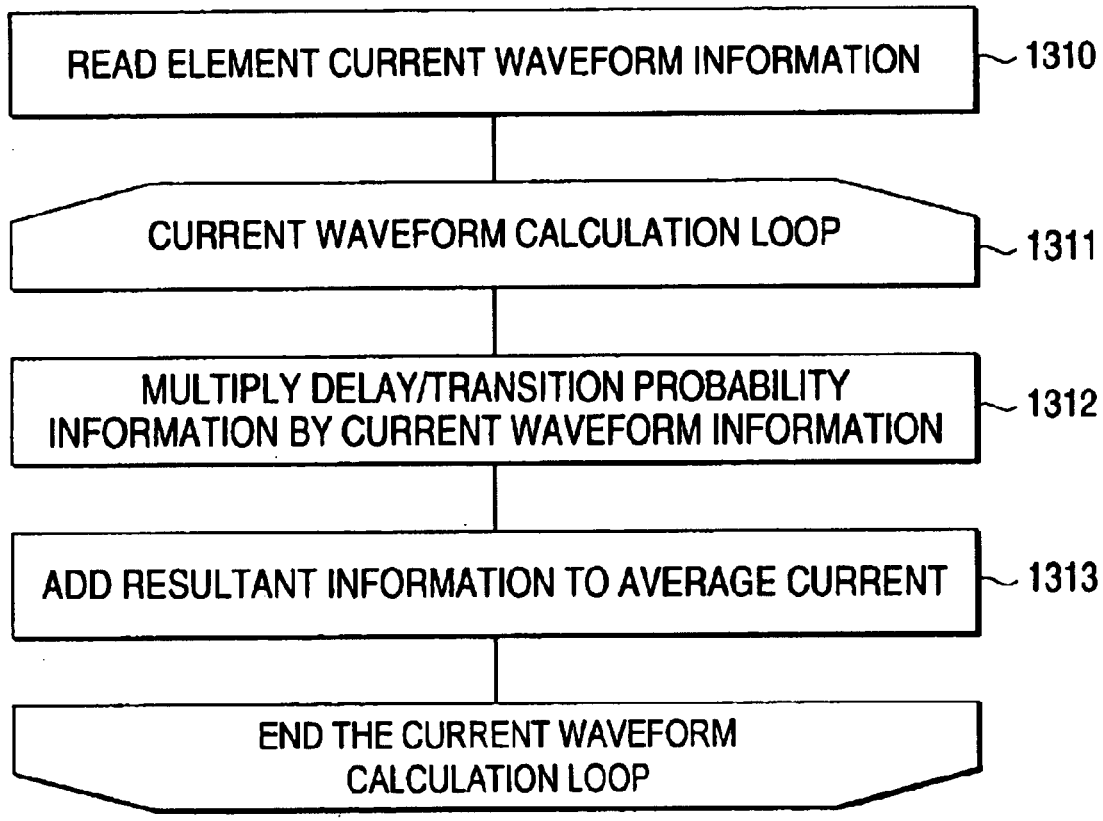
FIG. 14 is a flowchart of current waveform calculation processing according to the third embodiment.
Figure 15:
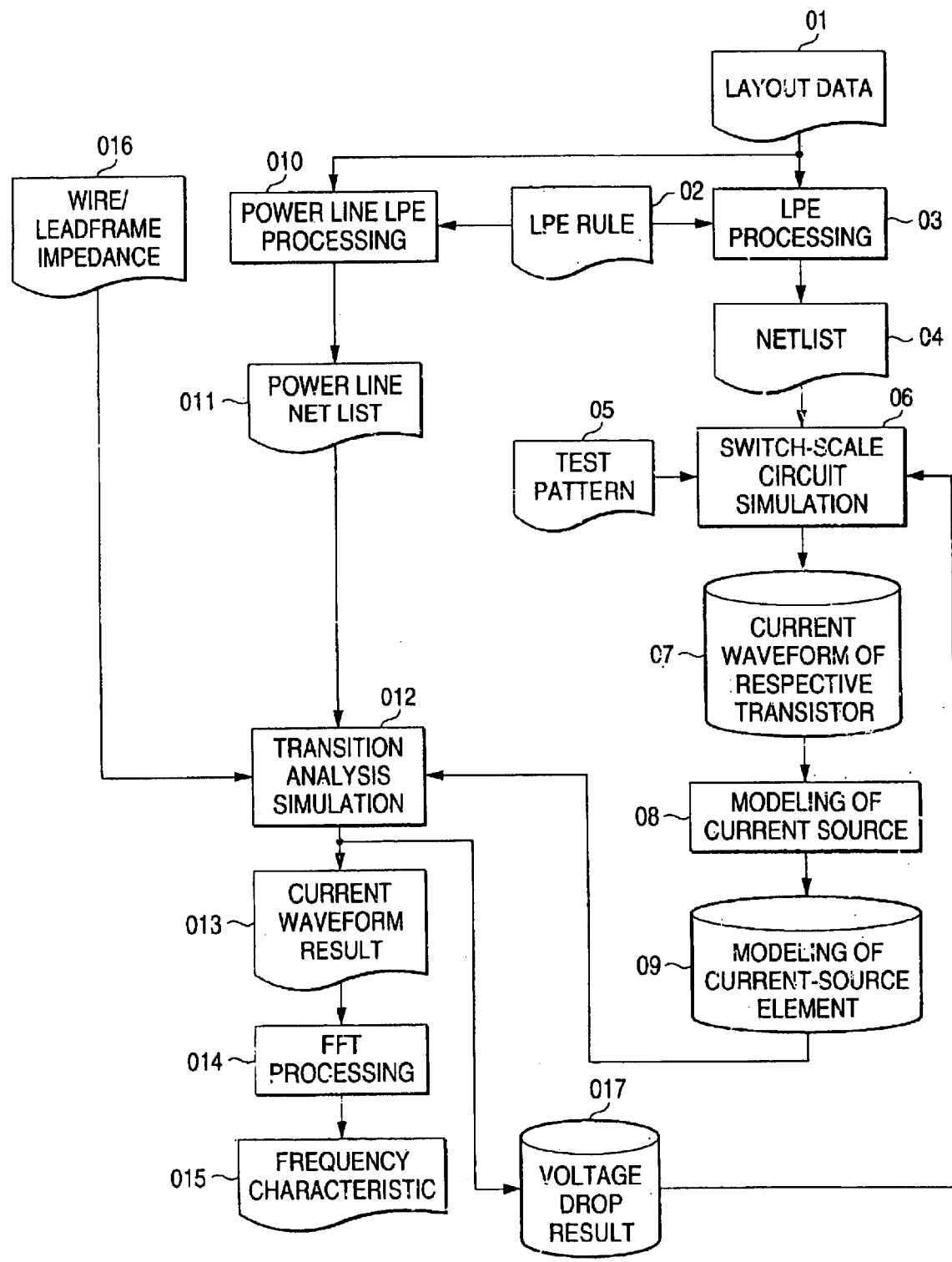
FIG. 15 is a flowchart showing a known EMI analysis method.
Figure 16:
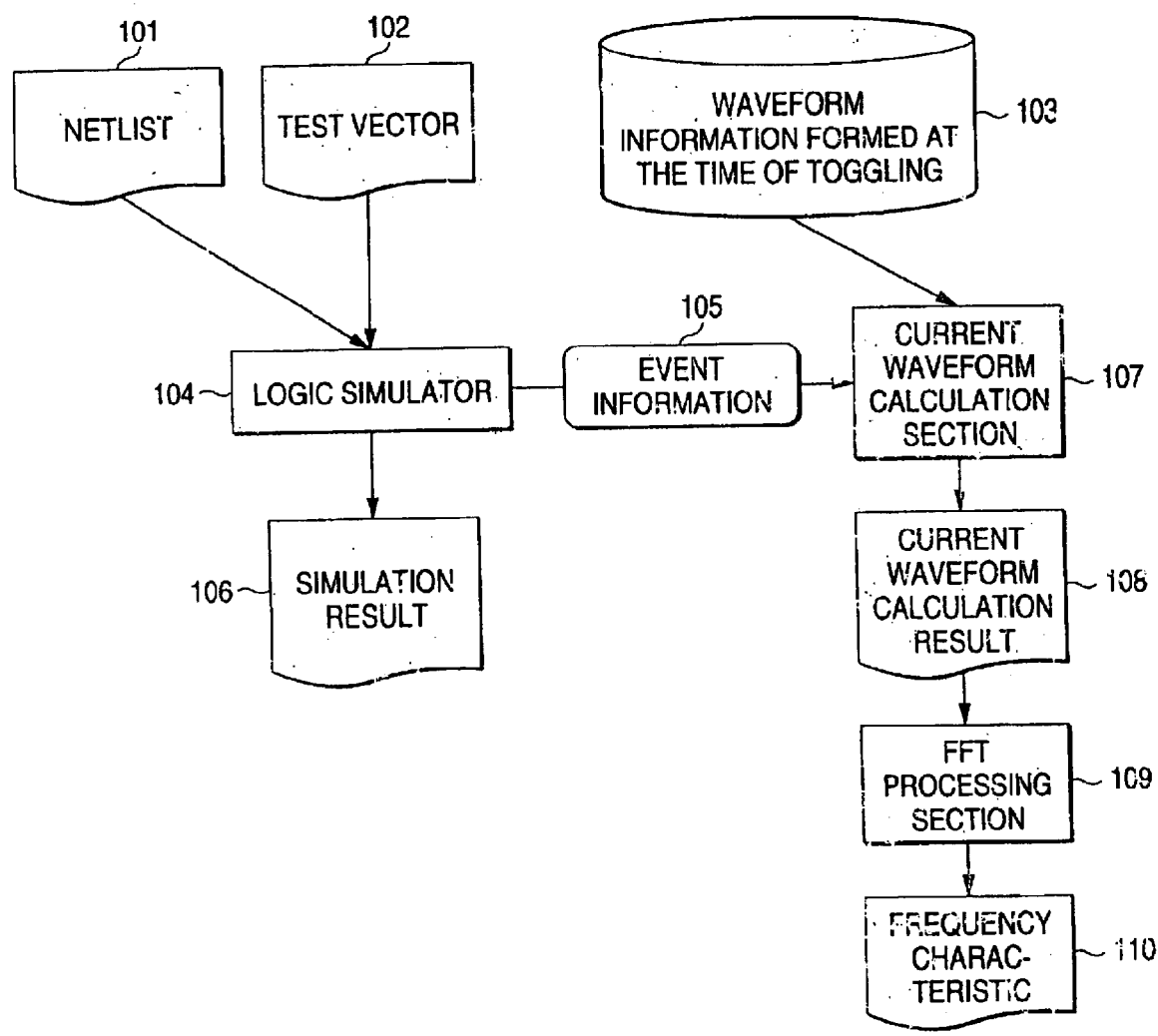
FIG. 16 is a flowchart showing a gate-level EMI dynamic analysis method.

FIG. 12 is a block diagram showing the overall flow of processing of the EMI analysis method according to the present embodiment. FIGS. 13A through 13C are illustrations showing the principle underlying the processing. FIG. 14 is a flowchart of average current waveform calculation means used in the processing. In a netlist 901, a circuit, which is the subject of EMI analysis, is represented as circuit data. Delay/transition probability 906 of each node is calculated from the netlist 901 and input transition probability 902 based on delay/propagation probability 904 (see FIG. 13A). Mean current waveform estimation means 908 produces mean current waveform information 909 (see FIG. 13C), based on a triangular waveform whose area is determined by the quantity of electric current, such that the delay/transition probability 906 is multiplied by element current waveform information 907 (see FIG. 13B). The thus-calculated mean current waveform information 909 is subjected to FFT processing 910 within a time domain that is determined using operating frequency information 912, thereby obtaining frequency characteristic information 911.

FIG. 14 shows a flowchart of processing by the average current waveform calculation means. The average current waveform calculation means reads element current waveform information from a table (step 1310) and performs a current waveform calculation loop (step 1311). The following processing is iterated until calculation of a current waveform is completed. The delay/transition probability 906 calculated from delay information and transition probability information is multiplied by element current waveform information 907 (see FIG. 13B) (step 1312). Based on a triangular waveform whose area is determined by the quantity of electric current, average electric current waveform estimation means 908 adds the result of multiplication as mean current, thereby deriving average current waveform information 909. The average current waveform information 909 is subjected to FFT processing 910, thereby determining frequency characteristic information 911.

The frequency characteristic of a subject circuit can be determined in the manner as mentioned previously, and a designer can analyze EMI that would arise in a circuit of interest.

According to the present EMI analysis method, delay propagation probability information is derived from static delay information and propagation probability information, and average current waveform information is derived from the delay propagation probability information. The thus-obtained average current waveform information is subjected to FFT processing, thereby enabling highly accurate EMI analysis. The EMI analysis method can analyze EMI components within a shorter period of time than a known gate-level dynamic analysis method can.

In addition to a distribution taking into consideration a path, a temperature/process/voltage distribution may be conceived as the delay/transition probability information shown in FIG. 13A.

In each of the foregoing embodiments, FFT processing has been used for analyzing a frequency. However, the present invention is not limited to FFT processing. Needless to say, another processing method, such as ordinary Fourier transformation, may alternatively be employed.

The present invention can facilitate evaluation of EMI developing in an LSI through a simulation, by means of very accurately analyzing, through static processing, variation in power-supply current which may be said to primarily account for EMI. Further, in contrast with dynamic analysis of EMI, which is embodied by a gate-level simulation or a like simulation, the present EMI analysis method can prevent an increase in processing time.

What is claimed is:

1. A simulation method of analyzing electromagnetic interference developing in an LSI, comprising:
   a correction step of correcting the amplitude of a current estimation waveform in each simulated node which has been previously prepared for each change in each simulated node, in accordance with the probability of variation in each simulated node;
   an addition step of adding current waveforms of all simulated nodes together within a period of time corresponding to one cycle, provided that the thus-corrected current waveform appears at time a signal arrives at each simulated node; and
   a frequency analysis step of analyzing the frequency of the current waveform calculated in the addition step.

2. The method of analyzing electromagnetic interference developing in an LSI according to claim 1, wherein the correction step includes a step of correcting the amplitude of a current estimation waveform, which has been prepared for each change in each simulated node, in accordance with the probability of variation in each simulated node and a distribution with respect to time.

3. The method of analyzing electromagnetic interference developing in an LSI according to claim 2, wherein each simulated node has a plurality of paths, and each of the current waveform is calculated in consideration of a case where each of the paths has a unique probability of change and signal arrival time.

4. The method of analyzing electromagnetic interference developing in an LSI according to claim 1, wherein each simulated node has a plurality of signal transmission paths (hereinafter referred to simply as "paths"), and each of the current waveforms is calculated in consideration of a case where each of the paths has a unique probability of change and signal arrival time.

5. A method of analyzing electromagnetic interference developing in an LSI, the method comprising:
   a waveform formation step of forming a current estimation waveform which has been prepared for each change in each simulated node, as if the waveform randomly arises within a plurality of predetermined cycles, in accordance with the probability of change in each simulated node and a time at which a signal arrives at each simulated node;
   adding the thus-prepared current estimation waveforms of all simulated nodes, to thereby derive a current waveform; and
   analyzing the frequency of the current waveform, thereby determining a noise characteristic of EMI.

6. The method of analyzing electromagnetic interference developing in an LSI according to claim 5, wherein each simulated node has a plurality of paths, and a current waveform is calculated in consideration of a case where each of the paths has a unique probability of change and signal arrival time.

7. A method of analyzing electromagnetic interference developing in an LSI, the method comprising:
   a waveform formation step of forming a current estimation waveform which has been prepared for each change in each simulated node, as if the waveform randomly arises within a plurality of predetermined cycles, in accordance with the probability of change in each simulated node and a distribution probability of time;
   adding the thus-prepared current estimation waveforms of all simulated nodes, to thereby derive a current waveform; and
   analyzing the frequency of the current waveform, thereby determining a noise characteristic of EMI.

8. The simulation method of analyzing electromagnetic interference developing in an LSI according to claim 7, wherein each simulated node has a plurality of paths, and a current wave form is calculated in consideration of a case where each of the paths has a unique probability of change and signal arrival time.

9. A simulation method of analyzing electromagnetic interference developing in an LSI, comprising:
   a correction step of correcting the amplitude of a current estimation waveform in each simulated node which has been previously prepared for each change in each simulated node, in accordance with the probability of variation in each simulated node;
   an addition step of adding current waveforms of all simulated nodes together within a period of time corresponding to one cycle, provided that thus-corrected current waveform appears at time a single arrives at each simulated node.

10. A simulation method of analyzing electromagnetic interference developing in an LSI, comprising:
    a correction step of correcting the amplitude of a current estimation waveform in each simulated node which has been previously prepared for each change in each simulated node, in accordance with the probability of variation in each simulated node;
    an addition step of adding current waveforms of all simulated nodes together within a period of time corresponding to one cycle, provided that thus-corrected current waveform appears at time a single arrives at each simulated node; and
    a voltage-Drop analysis step of analyzing the Voltage-Drop of the current waveform calculated in the addition step.

11. A simulation method of analyzing electromagnetic interference developing in an LSI, comprising:
    a correction step of correcting the amplitude of a current estimation waveform in each simulated node which has been previously prepared for each change in each simulated node, in accordance with the probability of variation in each simulated node;
    an addition step of adding current waveforms of all simulated nodes together with a period of time corresponding to one cycle, provided that thus-corrected current waveform appears at time a single arrives at each simulated node; and
    a power consumption analysis step of analyzing the power consumption of the current waveform calculated in the addition step.

* * * * *